(12) United States Patent
Ding et al.

(10) Patent No.: US 12,713,733 B2
(45) Date of Patent: Aug. 18, 2026

(54) BACK CONTACT SOLAR CELL, PREPARATION METHOD THEREFOR, AND PHOTOVOLTAIC MODULE

(71) Applicant: LONGI GREEN ENERGY TECHNOLOGY CO., LTD., Xi'an (CN)

(72) Inventors: Chao Ding, Xi'an (CN); Qingping Liu, Xi'an (CN); Hongchao Zhang, Xi'an (CN); Xinxing Xu, Xi'an (CN); Xuejian Zhang, Xi'an (CN); Hongbo Tong, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/147,792

(22) PCT Filed: Mar. 14, 2025

(86) PCT No.: PCT/CN2025/082637
§ 371 (c)(1),
(2) Date: Jul. 14, 2025

(87) PCT Pub. No.: WO2025/260860
PCT Pub. Date: Dec. 26, 2025

(65) Prior Publication Data

US 2026/0123091 A1 Apr. 30, 2026

(30) Foreign Application Priority Data

Jun. 17, 2024 (CN) ........................ 202410773793.4

(51) Int. Cl.
*H10F 77/14* (2025.01)
*H10F 19/90* (2025.01)
*H10F 77/70* (2025.01)

(52) U.S. Cl.
CPC ......... *H10F 77/147* (2025.01); *H10F 19/908* (2025.01); *H10F 77/707* (2025.01)

(58) Field of Classification Search
CPC ..... H10F 19/908; H10F 77/147; H10F 77/707
See application file for complete search history.

(56) References Cited

U.S. PATENT DOCUMENTS

2014/0020752 A1* 1/2014 Arimoto .............. H10F 77/703 438/96
2018/0138323 A1 5/2018 Harada et al.
(Continued)

FOREIGN PATENT DOCUMENTS

CN 216488083 U 5/2022
CN 115566099 A 1/2023
(Continued)

OTHER PUBLICATIONS

Machine translation of CN-115377232-B, Huang, Shi-liang. (Year: 2023).*

(Continued)

*Primary Examiner* — Mayla Gonzalez Ramos
(74) *Attorney, Agent, or Firm* — Fish & Richardson P.C.

(57) ABSTRACT

The present application discloses a back contact solar cell, a preparation method therefor, and a photovoltaic module. In one example, a back contact solar cell includes a substrate, a first doped layer and a second doped layer alternately arranged on a first surface of the substrate. A doping type of the first doped layer is opposite to a doping type of the second doped layer. A first isolation region is provided between an edge of the substrate and a boundary of the first doped layer adjacent to the edge, a second isolation region is provided between the edge of the substrate and a boundary of the second doped layer adjacent to the edge. A width of
(Continued)

at least a portion of the first isolation region is greater than a width of at least a portion of the second isolation region.

20 Claims, 3 Drawing Sheets

(56) References Cited

U.S. PATENT DOCUMENTS

| | | | | |
|---|---|---|---|---|
| 2018/0294366 | A1* | 10/2018 | Konishi | H10F 77/219 |
| 2024/0136455 | A1* | 4/2024 | Guo | H10F 19/90 |

FOREIGN PATENT DOCUMENTS

| | | | | |
|---|---|---|---|---|
| CN | 115579407 | A | 1/2023 | |
| CN | 218975459 | U | 5/2023 | |
| CN | 115377232 | B | * 10/2023 | H10F 19/80 |
| CN | 117317040 | A | 12/2023 | |
| CN | 117423754 | A | 1/2024 | |
| CN | 116864551 | B | 2/2024 | |
| CN | 117594673 | A | 2/2024 | |
| CN | 220439627 | U | 2/2024 | |
| CN | 118352414 | A | 7/2024 | |
| JP | 2017-175032 | A | 9/2017 | |
| KR | 101424538 | B1 | 8/2014 | |
| KR | 10-2016-0096084 | A | 8/2016 | |
| WO | 2023/050823 | A1 | 4/2023 | |
| WO | 2023/050824 | A1 | 4/2023 | |

OTHER PUBLICATIONS

Office Action in Australian Appln. No. 2025205164, mailed on Aug. 5, 2025, 7 pages.
International Search Report in International Appln. No. PCT/CN2025/082637, mailed on Jun. 17, 2025, 9 pages (with machine translation).
Office Action and Search Report in Chinese Appln. No. 202410773793.4, mailed on Jul. 27, 2024, 22 pages (with English translation).
Extended European Search Report in European Appln. No. 25737534.5, mailed on Mar. 19, 2026, 10 pages.

* cited by examiner

BACK CONTACT SOLAR CELL, PREPARATION METHOD THEREFOR, AND PHOTOVOLTAIC MODULE

CROSS-REFERENCE TO RELATED APPLICATIONS

This application is a 371 national stage application of PCT Application No. PCT/CN2025/082637, filed on Mar. 14, 2025, which claims priority to Chinese Patent Application No. 202410773793.4, filed on Jun. 17, 2024. The disclosures of the aforementioned applications are hereby incorporated by reference in their entireties.

TECHNICAL FIELD

The present disclosure relates to the field of photovoltaic technologies, and in particular, to a back contact solar cell, a preparation method therefor, and a photovoltaic module.

BACKGROUND

A back contact solar cell is a solar cell in which no electrode is arranged on a light receiving surface of a cell and positive and negative electrodes are all arranged on a back surface of the solar cell, so that blocking of the electrodes to the solar cell is reduced, a short-circuit current of the solar cell can be increased, and the energy conversion efficiency of the solar cell can be improved.

In the related art, a back surface of the back contact solar cell has an N-type doped layer and a P-type doped layer. Parts of the N-type doped layer and the P-type doped layer close to edges of the solar cell have large hidden hazards and high leakage risks.

SUMMARY

An objective of the present disclosure is to provide a back contact solar cell, a preparation method therefor, and a photovoltaic module, to lower a leakage risk and reduce hidden safety hazards.

To achieve the foregoing objective, the present disclosure provides the following technical solutions:

A back contact solar cell includes a substrate, a first doped layer, and a second doped layer. The substrate has a first surface and a second surface opposite to the first surface. The first doped layer and the second doped layer are alternately arranged on the first surface. A doping type of the first doped layer is opposite to a doping type of the second doped layer. In addition, the doping type of the second doped layer being the same as a doping type of the substrate.

The substrate has an edge. A first isolation region is provided between a boundary of the first doped layer adjacent to the edge and the edge. A second isolation region is provided between a boundary of the second doped layer adjacent to the edge and the edge. A width of at least a portion of the first isolation region is greater than a width of at least a portion of the second isolation region.

In the foregoing technical solution, a first isolation region is provided between a boundary of the first doped layer adjacent to the edge and the edge. A second isolation region is provided between a boundary of the second doped layer adjacent to the edge and the edge. Specifically, a portion of the edge is adjacent to the boundary of the first doped layer, and the first isolation region isolates the boundary of the first doped layer adjacent to the edge from the edge, to help suppress leakage. A portion of the edge is adjacent to the boundary of the second doped layer, and the second isolation region isolates the boundary of the second doped layer adjacent to the edge from the edge, to help suppress leakage.

The doping type of the second doped layer is the same as the doping type of the substrate. The doping type of the first doped layer is opposite to the doping type of the substrate. In consideration of that a PN junction region formed between the first doped layer and the substrate that have opposite doping types has a higher leakage risk, the width of the at least a portion of the first isolation region is made larger than the width of the at least a portion of the second isolation region, so that a wider first isolation region is arranged at a position at which the PN junction region is formed between the first doped layer and the substrate, to lower the leakage risk and reduce safety hazards.

In an implementation, the edge includes a first edge and a second edge arranged opposite to the first edge.

The back contact solar cell is a full-cut solar cell. The first surface is divided into two sections by a dividing line perpendicular to the first edge and the second edge. In one of the sections, a width of the first isolation region formed between a boundary of the first doped layer and the first edge is greater than a width of the second isolation region formed between a boundary of the second doped layer and the second edge. Alternatively, the back contact solar cell is a half-cut solar cell. A width of the first isolation region formed between a boundary of the first doped layer and the first edge is greater than a width of the second isolation region formed between a boundary of the second doped layer and the second edge.

By using the foregoing technical solution, regardless of whether the back contact solar cell is a full-cut solar cell or a half-cut solar cell, a larger isolation width between the boundary of the first doped layer and the edge of the solar cell can be achieved, thereby ensuring the stability and reliability of the performance of the back contact solar cell.

In an implementation, the edge includes a first edge, a second edge arranged opposite to the first edge, and a third edge located between the first edge and the second edge.

The first doped layer and the second doped layer are arranged in an interdigitated manner. The first doped layer includes a first connecting portion and a plurality of first interdigitated portions. At least one of the first interdigitated portions is electrically connected to the first connecting portion. The second doped layer includes a second connecting portion and a plurality of second interdigitated portions. At least one of the second interdigitated portions is electrically connected to the second connecting portion. The first connecting portion and the second connecting portion extend along the first edge and the second edge. A plurality of ones of the first interdigitated portions and a plurality of ones of the second interdigitated portions between the first connecting portion and the second connecting portion are respectively distributed in a plurality of rows. The first interdigitated portions in a plurality of rows and the second interdigitated portions in a plurality of rows are distributed in a staggered manner and at intervals.

The back contact solar cell is a half-cut solar cell. A width of the first isolation region formed between the first connecting portion and the first edge is greater than a width of the second isolation region formed between the second connecting portion and the second edge. Alternatively, the back contact solar cell is a full-cut solar cell. A width of the first isolation region formed between the first connecting portion and the first edge is greater than a width of the second isolation region formed between the second connecting portion and the second edge.

In an implementation, any row of the first interdigitated portions between the first connecting portion and the second connecting portion is continuous and uninterrupted, and any row of the second interdigitated portions between the first connecting portion and the second connecting portion is continuous and uninterrupted.

In an implementation, any row of the first interdigitated portions between the first connecting portion and the second connecting portion is interrupted to form a plurality of segments, and any row of the second interdigitated portions between the first connecting portion and the second connecting portion is interrupted to form a plurality of segments.

In an implementation, the third edge is adjacent to the boundary of the first interdigitated portions. When being processed, the isolation region near the first edge and the isolation region near the third edge can be consecutively processed, thereby facilitating processing and manufacturing, and improving processing efficiency of the back contact solar cell. Alternatively, the third edge is adjacent to the boundary of the second interdigitated portions. When being processed, the isolation region near the second edge and the isolation region near the third edge can be consecutively processed, thereby facilitating processing and manufacturing, and improving processing efficiency of the back contact solar cell.

In an implementation, one end of the third edge is connected to an end of the first edge by a first chamfer. An other end of the third edge is connected to an end of the second edge by a second chamfer. A boundary of the first doped layer is adjacent to the first chamfer, and a boundary of the second doped layer is adjacent to the second chamfer. Such an arrangement can reduce cracks at corners of the silicon wafer can be reduced, to prevent the corners of the silicon wafer from being cracked under the action of external stress.

The boundary of the first doped layer adjacent to the first chamfer is a stepped edge. Additionally/Alternatively, the boundary of the second doped layer adjacent to the second chamfer is an arc-shaped edge. For the first doped layer, for example, laser modification can be performed first, and then wet etching can be performed, so that the boundary of the first doped layer adjacent to the first chamfer is a stepped edge. While ensuring a larger width of the first isolation region between the first doped layer and the first chamfer, the stepped edge can disperse stress, to prevent stress from concentrating at the boundary of the first doped layer adjacent to the first chamfer, thereby reducing hidden cracking. In addition, the width of the second isolation region between the second doped layer and the second chamfer is smaller than the width of the first isolation region. For example, the second isolation region may be formed only by wet etching. The boundary of the second doped layer adjacent to the second chamfer is an arc-shaped edge, to ensure maximum current collection, and make it easier to print a grid line on the second doped layer.

Additionally/Alternatively, a spacing distance between a tip of the second interdigitated portion close to the first chamfer and the first connecting portion along an extending direction of the third edge is greater than a spacing distance between a tip of the remaining second interdigitated portions and the first connecting portion along the extending direction the third edge. Additionally/Alternatively, a spacing distance between a tip of the first interdigitated portion close to the second chamfer and the second connecting portion along the extending direction the third edge is greater than a spacing distance between a tip of the remaining first interdigitated portions and the second connecting portion along the extending direction the third edge. Because stress at a position of a chamfer of the solar cell is larger, which is more prone to hidden cracking, a spacing distance d3 between a tip of the second interdigitated portion close to the first chamfer and the first connecting portion is greater than a spacing distance between a tip of the remaining second interdigitated portions and the first connecting portion, and a spacing distance d4 between a tip of the first interdigitated portion close to the second chamfer and the second connecting portion is greater than a spacing distance between a tip of the remaining first interdigitated portions and the second connecting portion, thereby reducing defects, such as hidden cracking, of the first interdigitated portions and the second interdigitated portions.

In an implementation, one end of the third edge is connected to an end of the first edge by a first chamfer. An other end of the third edge is connected to an end of the second edge by a second chamfer.

The first interdigitated portions are adjacent to the third edge. An edge of a tip of the first interdigitated portion close to the second connecting portion is a beveled edge. The beveled edge gradually inclines toward a direction closer to the second chamfer in a direction away from the third edge. Alternatively, the second interdigitated portions are adjacent to the third edge. An edge of a tip of the second interdigitated portion close to the first connecting portion is a beveled edge. The beveled edge gradually inclines toward a direction closer to the first chamfer in a direction away from the third edge. Through such an arrangement, a pointed position of the beveled edge being away from the third edge can prevent stress from concentrating at the pointed position of the beveled edge and causing hidden cracking while making an area of the first doped layer near the first chamfer or an area of the second doped layer near the second chamfer larger, which can disperse stress in a region of the first doped layer close to the first chamfer or stress in a region of the second doped layer close to the second chamfer, thereby preventing stress concentration, and reducing hidden cracking.

In an implementation, a width of a portion of the first connecting portion adjacent to the first edge is d1, and a width of a portion of the second connecting portion adjacent to the second edge is d2, d1<d2.

In an implementation, 600 μm≤d1≤800 μm, and 800 μm≤d2≤1100 μm.

In an implementation, the edge includes a first edge, a second edge arranged opposite to the first edge, and a third edge located between the first edge and the second edge.

The first doped layer includes a plurality of first strip-shaped portions extending along the extending direction the third edge, and the second doped layer includes a plurality of second strip-shaped portions extending along the extending direction the third edge. The plurality of first strip-shaped portions and the plurality of second strip-shaped portions are sequentially and alternately spaced apart along an extending direction of the first edge or the second edge. Heads of two ends of the first strip-shaped portions and the second strip-shaped portions are respectively adjacent to the first edge and the second edge.

In an implementation, a boundary of the second strip-shaped portions is adjacent to the third edge. The second doped layer being close to the third edge can ensure better passivation of the edge of the solar cell. However, if the first doped layer having a doping type opposite to that of the substrate is close to the third edge, the first doped layer at a position of the third edge has higher recombination efficiency and a shorter minority carrier life time, which is not conducive to improving the photoelectric conversion efficiency.

In an implementation, a width of the first isolation region ranges from 80 μm to 200 μm; and/or a width of the second isolation region ranges from 10 μm to 50 μm; and/or a difference between the width of the first isolation region and the width of the second isolation region is greater than or equal to 30 μm and less than or equal to 190 μm, to prevent excessively small distances between the first doped layer and the edge and between the second doped layer and the edge from leading to a high leakage risk while preventing excessively large distances between the first doped layer and the edge and between the second doped layer and the edge from reducing an effective power generation area and affecting power generation efficiency.

In an implementation, the first isolation region and/or the second isolation region has a portion recessed into the substrate. A side of the recessed portion facing away from a side wall of the substrate forms an inclined portion that inclines relative to the first surface. An angle between the inclined portion and the first surface is greater than or equal to 53° and less than or equal to 57°.

In an implementation, the first isolation region and/or the second isolation region has a portion recessed into the substrate. A bottom surface of the recessed portion forms a textured structure. The textured structure includes a pyramidal textured structure. A bottom wall of the first isolation region and a bottom wall of the second isolation region are pyramidal textured structures, which can increase a path length for water vapor to enter the solar cell and reduce entry of water vapor, thereby preventing water vapor from affecting performance of the doped layer.

In an implementation, a length and/or a width of the substrate ranges from 166 μm to 210 μm. Additionally/Alternatively, a thickness of the substrate ranges from 100 μm to 170 μm. Additionally/Alternatively, a thickness of the first doped layer and/or the second doped layer ranges from 150 nm to 400 nm. Additionally/Alternatively, a third isolation region is arranged between the first doped layer and the second doped layer, a width of the third isolation region ranging from 60 μm to 200 μm. Therefore, while ensuring a good field passivation effect, a poly thickness is reduced as much as possible, to reduce the parasite absorption.

A photovoltaic module includes at least two back contact solar cells according to any one of the foregoing embodiments and a plurality of electrical connectors. The plurality of electrical connectors connect the at least two back contact solar cells. Compared with the related art, beneficial effects of the photovoltaic module provided in this embodiment of the present disclosure are the same as the beneficial effects of the foregoing back contact solar cell, and details are not described herein again.

In an implementation, the edge includes a first edge and a second edge arranged opposite to the first edge. The first doped layer and the second doped layer are arranged in an interdigitated manner. The first doped layer includes a first connecting portion and a plurality of first interdigitated portions. At least one of the first interdigitated portions is electrically connected to the first connecting portion. The second doped layer includes a second connecting portion and a plurality of second interdigitated portions. At least one of the second interdigitated portions is electrically connected to the second connecting portion. The first connecting portion and the second connecting portion extend along the first edge and the second edge. A plurality of ones of the first interdigitated portions and a plurality of ones of the second interdigitated portions between the first connecting portion and the second connecting portion that are adjacent to each other are respectively distributed in a plurality of rows. The first interdigitated portions in a plurality of rows and the second interdigitated portions in a plurality of rows are distributed in a staggered manner and at intervals.

The back contact solar cell is a half-cut solar cell. The first connecting portion is adjacent to the first edge, and the second connecting portion is adjacent to the second edge.

Orthographic projections of the plurality of electrical connectors and the first connecting portion of the first doped layer and/or the second connecting portion of the second doped layer adjacent to the first edge and/or the second edge do not overlap on the back contact solar cell. In this way, arranging the electrical connectors to deviate from the first connecting portion and the second connecting portion close to the first edge and/or the second edge can prevent the electrical connectors from damaging the first connecting portion and the second connecting portion close to the first edge and/or the second edge, thereby ensuring collection efficiency of the first connecting portion and the second connecting portion close to the first edge and/or the second edge while further improving electrical isolation.

A preparation method for a back contact solar cell includes:

- providing a substrate, the substrate having a first surface and a second surface opposite to the first surface, the first surface having an edge, and the first surface having a first doped layer, a second doped layer, and a third region between the first doped layer and the second doped layer;
- forming the first doped layer on the first surface of the substrate and patterning the first doped layer, a doping type of the first doped layer being opposite to a doping type of the substrate;
- forming the second doped layer on the first surface of the substrate and patterning the second doped layer, a doping type of the second doped layer being opposite to the doping type of the first doped layer; and
- forming a first isolation region running through the first doped layer along a thickness direction of the substrate when patterning the first doped layer or the second doped layer, the first isolation region spacing the first doped layer from the edge; and forming a second isolation region running through the second doped layer along the thickness direction of the substrate, the second isolation region spacing the second doped layer from the edge, and a width of the first isolation region being greater than a width of the second isolation region.

Compared with the related art, beneficial effects of the preparation method for a back contact solar cell provided in this embodiment of the present disclosure are the same as the beneficial effects of the foregoing back contact solar cell, and details are not described herein again.

In an implementation, the step of forming a first isolation region running through the first doped layer along a thickness direction of the substrate includes: first irradiating a portion of the first doped layer at a position corresponding to the first isolation region with a laser, and then forming the first isolation region running through the first doped layer along the thickness direction of the substrate by etching using an etching solution.

The step of forming a second isolation region running through the second doped layer along the thickness direction of the substrate includes: forming the second isolation region running through the second doped layer along the thickness direction of the substrate by etching using the etching solution.

In an implementation, the forming a first isolation region running through the first doped layer along a thickness direction of the substrate includes: forming a portion of the first isolation region recessed into the substrate. A bottom surface of the recessed portion forms a textured structure. The textured structure includes a pyramidal textured structure.

The forming a second isolation region running through the second doped layer along the thickness direction of the substrate includes: forming a portion of the second isolation region recessed into the substrate. A bottom surface of the recessed portion forms a textured structure. The textured structure includes a pyramidal textured structure. A bottom wall of the first isolation region and a bottom wall of the second isolation region are pyramidal textured structures, which can increase a path length for water vapor to enter the solar cell and reduce entry of water vapor, thereby preventing water vapor from affecting performance of the doped layer.

BRIEF DESCRIPTION OF THE DRAWINGS

The accompanying drawings described herein are used to provide a further understanding of the present disclosure, and form a part of the present disclosure. Exemplary embodiments of the present disclosure and description thereof are used to explain the present disclosure, and do not constitute any inappropriate limitation to the present disclosure. In the accompanying drawings.

REFERENCE SIGNS

Figures 1, 2:
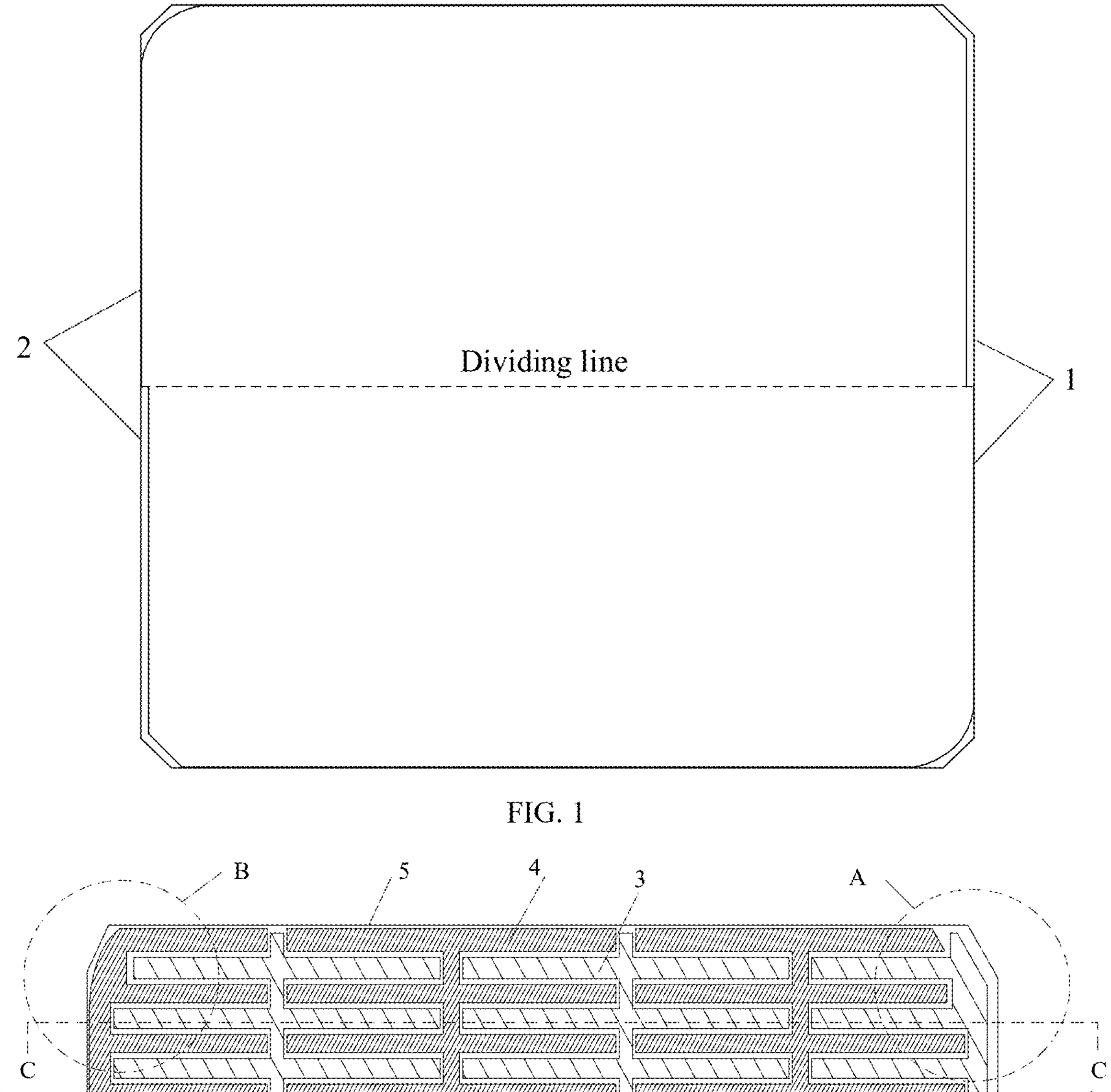
FIG. 1 is a schematic overall diagram of a back contact solar cell according to an embodiment of the present disclosure.
FIG. 2 is a schematic partial diagram of a first surface of a back contact solar cell according to an embodiment of the present disclosure.

1—first edge, 2—second edge, 3—first doped layer, 3*a*—stepped edge, 4—second doped layer, 4*a*—beveled edge, 4b—arc-shaped edge, 5—third edge, 6—first isolation region, 7—first chamfer, 8—third isolation region, 9—second isolation region, 10—second chamfer, 11—passivation layer, 12—substrate.

DETAILED DESCRIPTION

To make the technical problems to be resolved by, the technical solutions, and the beneficial effects of the present disclosure clearer and more comprehensible, the following further describes the present disclosure in detail with reference to the accompanying drawings and embodiments. It should be understood that, the specific embodiments described herein are merely used for describing the present disclosure and are not intended to limit the present disclosure.

It should be noted that when an element is described as being "fixed on" or "arranged on" another element, the element may be directly located on the another element or indirectly located on the another element. When an element is described as being "connected to" another element, the element may be directly connected to the another element or indirectly connected to the another element.

In addition, the terms "first" and "second" are used for descriptive purposes only and are not to be construed as indicating or implying relative importance or implicitly indicating a quantity of technical features indicated. Therefore, a feature defined by "first" or "second" may explicitly indicate or implicitly include one or more features. In the description of the present disclosure, "a plurality of" means two or more, unless otherwise definitely and specifically limited. "Several"means one or more, unless otherwise definitely and specifically limited.

In the description of the present disclosure, it should be understood that orientation or position relationships indicated by the terms such as "on", "below", "front", "rear", "left", "right", and the like are based on orientation or position relationships shown in the accompanying drawings, and are used only for ease and brevity of illustration of the present disclosure and description, rather than indicating or implying that the mentioned device or element needs to have a particular orientation or needs to be constructed and operated in a particular orientation. Therefore, such terms should not be construed as a limitation to the present disclosure.

In the description of the present disclosure, it should be noted that, unless otherwise explicitly specified or defined, the terms such as "install", "connect", and "connection" should be understood in a broad sense. For example, the connection may be a fixed connection, a detachable connection, or an integral connection; or may be a mechanical connection or an electrical connection; or may be a direct connection, an indirect connection through an intermediate, or internal communication between two elements or an interaction relationship between two elements. A person of ordinary skill in the art can understand specific meanings of the terms in the present disclosure based on specific situations.

A most significant characteristic of the back contact solar cell is that all metal contacts are located on a back surface of the solar cell, and a front surface affected by blockage from a metal electrode. Therefore, the back contact solar cell has a higher short-circuit current Isc. The back surface of the back contact solar cell can also allow for a wide metal grid line to reduce the series resistance Rs, so that a fill factor (FF) can be improved. In addition, the solar cell with the front surface being not blocked has high conversion efficiency and is aesthetic, and all-back-contact electrodes are easy to assemble. An IBC solar cell is one of existing technical directions for achieving efficient crystalline silicon solar cells.

Figures 4, 5, 6:
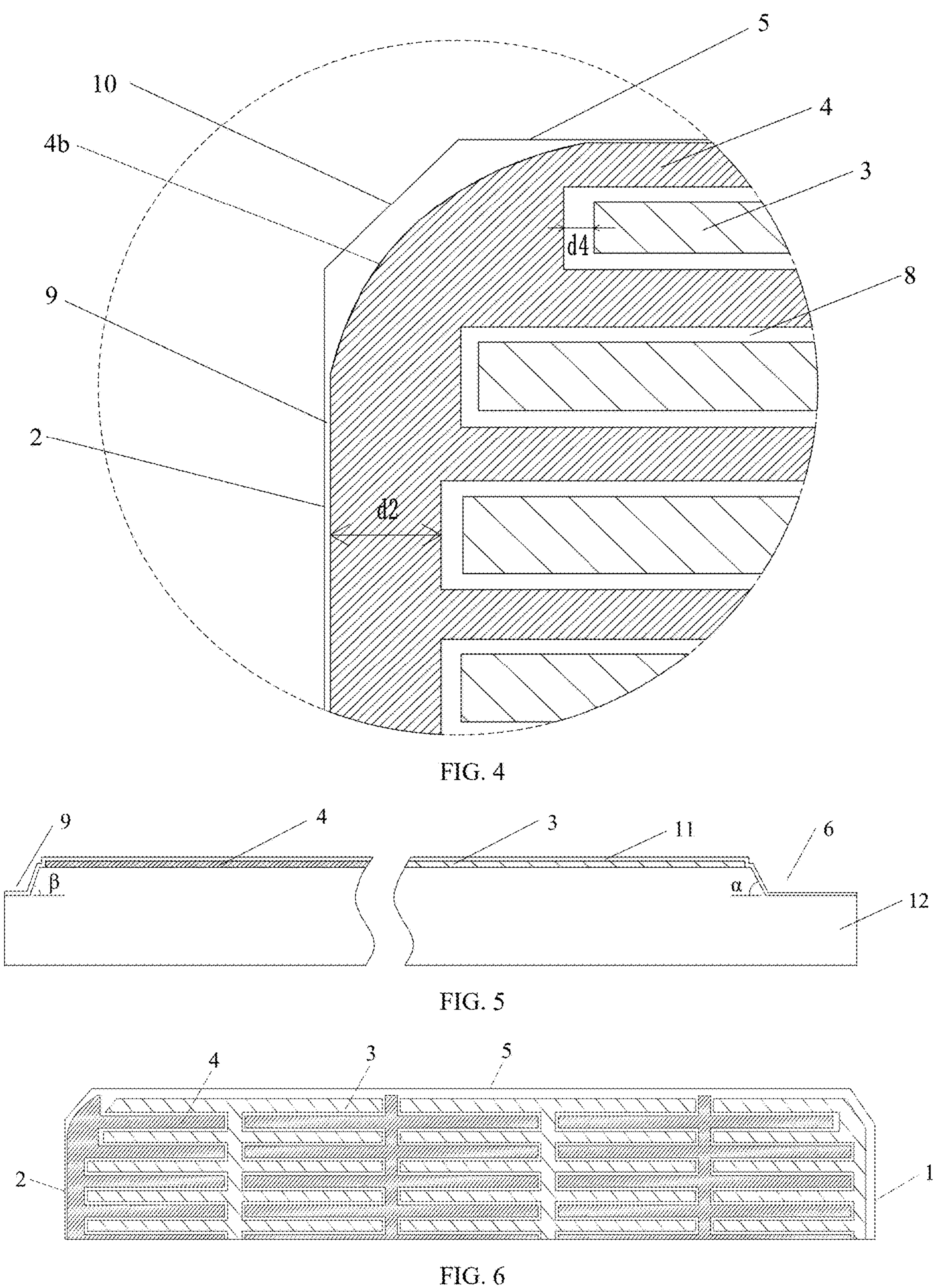
FIG. 4 is a partial enlarged view of a region B in FIG. 2.
FIG. 5 is a partial cross-sectional view taken along C-C in FIG. 2 according to an embodiment of the present disclosure.
FIG. 6 is a schematic partial diagram of a first surface of a back contact solar cell according to another embodiment of the present disclosure.

Specifically, as shown in FIG. 5, the back contact solar cell generally includes a substrate 12, a first doped layer 3, and a second doped layer 4. The substrate 12 has a first surface and a second surface opposite to the first surface. The second surface is a light receiving surface of the back contact solar cell. The first surface is a back surface of the back contact solar cell. The first doped layer 3 and the second doped layer 4 are alternately arranged on the first surface of the substrate 12. The first doped layer 3 and the second doped layer 4 have opposite doping types, to respectively collect and export electrons and holes, to form photocurrents.

The substrate 12 has an edge. The edge is arranged around a periphery of the substrate 12. It may be understood that the edge includes a closed shape such as a polygonal ring, a square ring, a rounded square ring, and a circular ring. A first isolation region 6 is provided between a boundary of the first doped layer 3 adjacent to the edge and the edge. A second isolation region 9 is provided between a boundary of the second doped layer 4 adjacent to the edge and the edge. Specifically, a portion of the edge is adjacent to the boundary of the first doped layer 3, and the first isolation region 6 isolates the boundary of the first doped layer 3 adjacent to the edge from the edge, to help suppress leakage. A portion of the edge is adjacent to the boundary of the second doped layer 4, and the second isolation region 9 isolates the boundary of the second doped layer 4 adjacent to the edge from the edge, to help suppress leakage.

The so-called isolation regions (the first isolation region 6 and the second isolation region 9) are regions in which electrons/holes are not collected, and there is no contribution of a current. Alternatively, there is no doped layer in the regions, and further, there is no photocurrent generation and collection. The isolation regions space boundaries of the doped layers (the first doped layer 3 and the second doped layer 4) from the edge of the substrate 12, to ensure electrical insulation.

The doping type of the second doped layer 4 is the same as the doping type of the substrate 12. The doping type of the first doped layer 3 is opposite to the doping type of the substrate 12. In consideration of that a PN junction region formed between the first doped layer 3 and the substrate 12 that have opposite doping types has a higher leakage risk, the width of the at least a portion of the first isolation region 6 is made larger than the width of the at least a portion of the second isolation region 9, that is, all widths of the first isolation region 6 are larger than all widths of the second isolation region 9, or some widths of the first isolation region 6 are larger than some widths of the second isolation region 9, so that a wider first isolation region 6 is arranged at a position at which the PN junction region is formed between the first doped layer 3 and the substrate 12, to lower the leakage risk and reduce safety hazards.

The substrate 12 is a semiconductor substrate. A material of the substrate 12 may be selected from a material such as silicon (Si) or germanium (Ge) or a material such as gallium arsenide (GaAs). Apparently, in terms of a conductivity type, the substrate 12 may be an intrinsic conductive substrate, an n-type conductive substrate, or a p-type conductive substrate. In an embodiment, the substrate 12 is a p-type conductive substrate or an n-type conductive substrate. Compared with an intrinsic conductive substrate, a p-type conductive substrate or an n-type conductive substrate has better conductivity, so that a finally prepared back contact solar cell has lower body resistivity, thereby improving efficiency of the back contact solar cell.

For example, the substrate 12 is an n-type silicon substrate. Compared with a p-type conductive substrate, an n-type silicon substrate has advantages such as a long minority carrier lifetime, no light decay, and good weak-light performance.

The first doped layer 3 and the second doped layer 4 are also both semiconductor doped layers. In terms of an internal arrangement form of a material, the first doped layer 3 and the second doped layer 4 may be amorphous, microcrystalline, monocrystalline, nanocrystalline, polycrystalline, or the like, and may be additionally formed on the substrate 12 through a deposition technology, or the doped layers may be formed in the substrate 12 in an in-situ doping manner such as ion implantation. In terms of a specific material, materials of the first doped layer 3 and the second doped layer 4 may be silicon (Si), germanium (Ge), silicon carbide (SiCx), gallium arsenide (GaAs), or the like. In terms of the conductivity type, the first doped layer 3 and the second doped layer 4 may be an n-type doped layer or a p-type doped layer.

In some examples, when the substrate 12 is an n-type substrate, the first doped layer 3 may be a p-type doped layer, and the second doped layer 4 may be an n-type doped layer. Alternatively, when the substrate 12 is a p-type substrate, the first doped layer 3 may be an n-type doped layer, and the second doped layer 4 may be a p-type doped layer.

For example, the substrate 12 is an n-type silicon substrate, the first doped layer 3 is a boron-doped p-type doped layer, and the second doped layer 4 is a phosphorus-doped n-type doped layer. In this case, because a heavily phosphorus-doped region has greater solubility for metal impurities, phosphorus possessed in the second doped layer 4 can provide phosphorus gettering passivation for the first doped layer 3, thereby improving solar cell efficiency.

In some specific embodiments, as shown in FIG. 2, the edge includes a first edge 1 and a second edge 2 opposite to the first edge 1. That is, the first edge 1 and the second edge 2 are parallel to each other and are respectively located on two opposite sides of the first surface. A first isolation region 6 is arranged between the first doped layer 3 and the first edge 1 or second edge 2 adjacent to the first doped layer 3. A second isolation region 9 is arranged between the second doped layer 4 and the first edge 1 or second edge 2 adjacent to the second doped layer 4. Specifically, the first edge 1 may be only adjacent to the first doped layer 3. In this case, the first isolation region 6 is arranged between the first edge 1 and the first doped layer 3. Alternatively, the first edge 1 may be only adjacent to the second doped layer 4. In this case, the second isolation region 9 is arranged between the first edge 1 and the second doped layer 4. Alternatively, one portion of the first edge 1 is adjacent to the first doped layer 3 and an other portion thereof is adjacent to the second doped layer 4. In this case, the first isolation region 6 is arranged between the one portion of the first edge 1 and the first doped layer 3, and the second isolation region 9 is arranged between the other portion of the first edge 1 and the second doped layer 4. Similarly, the second edge 2 may be only adjacent to the first doped layer 3. In this case, the first isolation region 6 is arranged between the second edge 2 and the first doped layer 3. Alternatively, the second edge 2 may be only adjacent to the second doped layer 4. In this case, the second isolation region 9 is arranged between the second edge 2 and the second doped layer 4. Alternatively, one portion of the second edge 2 is adjacent to the first doped layer 3 and an other portion thereof is adjacent to the second doped layer 4. In this case, the first isolation region 6 is arranged between the one portion of the second edge 2 and the first doped layer 3, and the second isolation region 9 is arranged between the other portion of the second edge 2 and the second doped layer 4.

In some implementations, a width of the second isolation region 9 may be close to 0. The second isolation region 9 can be formed by means, such as etching, unintentionally and is formed by side-etching the second doped layer 4 at the edge by an etching solution, and further, the second isolation region 9 is formed at an edge position at which the second doped layer 4 is slightly removed. In this embodiment, a width of the second isolation region 9 at a position close to a corner (that is, the chamfer below and a right-angle position of a half-cut solar cell) may be greater than 0, and a width of the second isolation region 9 at a position away from the corner may be basically 0.

Further, the first surface further has a third edge 5 located between the first edge 1 and the second edge 2. The third edge 5 may be perpendicular to the first edge 1 and the second edge 2. In this embodiment, as shown in FIG. 6, the third edge 5 may be adjacent to a boundary of the first doped layer 3. A first isolation region 6 is arranged between the boundary of the first doped layer 3 and the third edge 5. Alternatively, as shown in FIG. 2, the third edge 5 is adjacent to a boundary of the second doped layer 4. A second isolation region 9 is arranged between the boundary of the second doped layer 4 and the third edge 5. In this technical solution, the boundary of the first doped layer 3 or the second doped layer 4 may be spaced apart from the third edge 5, to help suppress leakage.

As shown in FIG. 1, the back contact solar cell may be a full-cut solar cell. As shown in FIG. 2 and FIG. 6, the back contact solar cell may alternatively be a half-cut solar cell.

When the back contact solar cell is a full-cut solar cell, the first surface is divided into two sections by a dividing line perpendicular to the first edge 1 and the second edge 2. In one of the sections, a width of the first isolation region 6 formed between a boundary of the first doped layer 3 and the first edge 1 is greater than a width of the second isolation region 9 formed between a boundary of the second doped layer 4 and the second edge 2. Types of doped layers adjacent to the first edge 1 and the second edge 2 in the other section are not specifically limited. For example, in the other section, a second isolation region 9 may be formed between a boundary of the second doped layer 4 and the first edge 1, and a first isolation region 6 may be formed between a boundary of the first doped layer 3 and the second edge 2. Alternatively, in the two sections, a first isolation region 6 is formed between a boundary of the first doped layer 3 and the first edge 1, and a second isolation region 9 is formed between a boundary of the second doped layer 4 and the second edge 2. Alternatively, in the two sections, a first isolation region 6 is formed between a boundary of the first doped layer 3 and the second edge 2, and a second isolation region 9 is formed between a boundary of the second doped layer 4 and the first edge 1. Specifically, the two sections of the first surface divided by the dividing line are respectively a first section and a second section.

When the back contact solar cell is a full-cut solar cell, for example, the first edge 1 is only adjacent to a boundary of a first connecting portion, and a first isolation region 6 is formed between the first edge 1 and the boundary of the first connecting portion. In addition, the second edge 2 is only adjacent to a boundary of a second connecting portion, and a second isolation region 9 is formed between the second edge 2 and the boundary of the second connecting portion. In this embodiment, the third edge 5 may be adjacent to a boundary of first interdigitated portions, and a first isolation region 6 is formed between the third edge 5 and the boundary of the first interdigitated portions. Alternatively, the third edge 5 may be adjacent to a boundary of second interdigitated portions, and a second isolation region 9 is formed between the third edge 5 and the boundary of the second interdigitated portions.

Alternatively, the first edge 1 is only adjacent to a boundary of a second connecting portion, and a second isolation region 9 is formed between the first edge 1 and the boundary of the second connecting portion. In addition, the second edge 2 is only adjacent to a boundary of a first connecting portion, and a first isolation region 6 is formed between the second edge 2 and the boundary of the first connecting portion. In this embodiment, the third edge 5 may be adjacent to a boundary of first interdigitated portions, and a first isolation region 6 is formed between the third edge 5 and the boundary of the first interdigitated portions. Alternatively, the third edge 5 may be adjacent to a boundary of second interdigitated portions, and a second isolation region 9 is formed between the third edge 5 and the boundary of the second interdigitated portions.

In the foregoing two embodiments, the first doped layer 3, the second doped layer 4, the first isolation region 6, and the second isolation region 9 in the two sections may be symmetrically arranged relative to the dividing line, to facilitate processing and manufacturing.

When the back contact solar cell is a half-cut solar cell, for example, the first edge 1 in the first section is adjacent to a boundary of a first connecting portion, and a first isolation region 6 is formed between the first edge 1 and the boundary of the first connecting portion. In addition, the first edge 1 in the second section is adjacent to a boundary of a second connecting portion, and a second isolation region 9 is formed between the first edge 1 and the boundary of the second connecting portion. The second edge 2 in the first section is adjacent to a boundary of the second connecting portion and a second isolation region 9 is formed between the second edge 2 and the boundary of the second connecting portion; and the second edge 2 in the second section is adjacent to a boundary of the first connecting portion and a first isolation region 6 is formed between the second edge 2 and the boundary of the first connecting portion. In this embodiment, the third edge 5 may be adjacent to a boundary of first interdigitated portions, and a first isolation region 6 is formed between the third edge 5 and the boundary of the first interdigitated portions. Alternatively, the third edge 5 may be adjacent to a boundary of second interdigitated portions, and a second isolation region 9 is formed between the third edge 5 and the boundary of the second interdigitated portions.

Alternatively, the first edge 1 in the first section is adjacent to a boundary of a second connecting portion, and a second isolation region 9 is formed between the first edge 1 and the boundary of the second connecting portion. In addition, the first edge 1 in the second section is adjacent to a boundary of a first connecting portion, and a first isolation region 6 is formed between the first edge 1 and the boundary of the first connecting portion. The second edge 2 in the first section is adjacent to a boundary of a first connecting portion, and a first isolation region 6 is formed between the second edge 2 and the boundary of the first connecting portion. In addition, the second edge 2 in the second section is adjacent to a boundary of a second connecting portion, and a second isolation region 9 is formed between the second edge 2 and the boundary of the second connecting portion. In this embodiment, the third edge 5 may be adjacent to a boundary of first interdigitated portions, and a first isolation region 6 is formed between the third edge 5 and the boundary of the first interdigitated portions. Alternatively, the third edge 5 may be adjacent to a boundary of second interdigitated portions, and a second isolation region 9 is formed between the third edge 5 and the boundary of the second interdigitated portions.

In the foregoing two embodiments, the first doped layer 3, the second doped layer 4, the first isolation region 6, and the second isolation region 9 in the two sections may be centrally symmetrically arranged relative to the dividing line, to facilitate processing and manufacturing.

In another embodiment, when the back contact solar cell is a half-cut solar cell, for example, the first edge 1 is adjacent to a boundary of the first doped layer 3, and a first isolation region 6 is formed between the boundary of the first doped layer 3 and the first edge 1. The second edge 2 is adjacent to a boundary of the second doped layer 4, and a second isolation region 9 is formed between the boundary of the second doped layer 4 and the second edge 2. Alternatively, the first edge 1 is adjacent to a boundary of the second doped layer 4, and a first isolation region 9 is formed between the boundary of the second doped layer 4 and the first edge 1. The second edge 2 is adjacent to a boundary of the first doped layer 3, and a second isolation region 6 is formed between the boundary of the first doped layer 3 and the second edge 2. In this embodiment, the third edge 5 may be adjacent to a boundary of first interdigitated portions, and a first isolation region 6 is formed between the third edge 5 and the boundary of the first interdigitated portions. Alternatively, the third edge 5 may be adjacent to a boundary of second interdigitated portions, and a second isolation region 9 is formed between the third edge 5 and the boundary of the second interdigitated portions.

By using the foregoing technical solution, regardless of whether the back contact solar cell is a full-cut solar cell or a half-cut solar cell, a larger isolation width between the boundary of the first doped layer 3 and the edge of the solar cell can be achieved, thereby ensuring the stability and reliability of the performance of the back contact solar cell.

It should be noted that during processing and manufacturing of a half-cut solar cell, a full-cut solar cell may be first formed by processing, and then, the full-cut solar cell is cut, to obtain two half-cut solar cells. Alternatively, a silicon wafer is first cut to obtain half-cut silicon wafers, and then the half-cut silicon wafers are processed to finally form half-cut solar cells. It may be learned that the technology of the present disclosure is also applicable to a three-cut wafer, a four-cut wafer, a five-cut wafer, a six-cut wafer, and a more-cut wafer, which are all obtained by dividing a rectangular wafer into a plurality of sub-wafers equally or not equally. A sub-water may be rectangular in shape. For example, for a 210 mm*210 mm rectangular wafer, a size of a half-cut solar cell is 105 mm*210 mm, and a size of each sub-wafer of a three-cut wafer is 70 mm*210 mm. By analogy, sub-wafers of more-cut wafers can be obtained.

In another specific embodiment, the first doped layer 3 and the second doped layer 4 are arranged in an interdigitated manner. The first doped layer 3 includes a first connecting portion and a plurality of first interdigitated portions. At least one of the first interdigitated portions is electrically connected to the first connecting portion. The second doped layer 4 includes a second connecting portion and a plurality of second interdigitated portions. At least one of the second interdigitated portions is electrically connected to the second connecting portion. The first connecting portion and the second connecting portion extend along the first edge and the second edge. A plurality of ones of the first interdigitated portions and a plurality of ones of the second interdigitated portions between the first connecting portion and the second connecting portion are respectively distributed in a plurality of rows. That is, a plurality of ones of the first interdigitated portions and a plurality of ones of the second interdigitated portions between the first connecting portion or the second connecting portion adjacent to the first edge 1 and the first connecting portion or the second connecting portion adjacent to the second edge 2 are respectively distributed in a plurality of rows. The first interdigitated portions in a plurality of rows and the second interdigitated portions in a plurality of rows are distributed in a staggered manner and at intervals.

In an example, any row of the first interdigitated portions between the first connecting portion and the second connecting portion is continuous and uninterrupted, and any row of the second interdigitated portions between the first connecting portion and the second connecting portion is continuous and uninterrupted. Any row of the first interdigitated portions between the first connecting portion and the second connecting portion is connected to the first connecting portion, and any row of the second interdigitated portions between the first connecting portion and the second connecting portion is connected to the second connecting portion. In this example, a plurality of first connecting portions and a plurality of second connecting portions may be provided, and the plurality of first connecting portions and the plurality of second connecting portions are arranged in a staggered manner and at intervals along an extending direction of the third edge. In this example, along an extending direction of the third edge 5, any row of the first interdigitated portions may be interrupted by a second connecting portion adjacent to neither of the first edge and the second edge, and any row of the second interdigitated portions may be interrupted by a first connecting portion adjacent to neither of the first edge 1 and the second edge 2. However, any row of the first interdigitated portions between the first connecting portion and the second connecting portion that are adjacent to each other is continuous and uninterrupted, and any row of the second interdigitated portions between the first connecting portion and the second connecting portion that are adjacent to each other is continuous and uninterrupted. Any row of the first interdigitated portions between the first connecting portion and the second connecting portion that are adjacent to each other is connected to the first connecting portion, and any row of the second interdigitated portions between the first connecting portion and the second connecting portion that are adjacent to each other is connected to the second connecting portion.

In another example, any row of the first interdigitated portions between the first connecting portion and the second connecting portion is interrupted to form a plurality of segments, and any row of the second interdigitated portions between the first connecting portion and the second connecting portion is interrupted to form a plurality of segments. In this example, one first connecting portion and one second connecting portion are provided, and at least one third connecting portion or no other connecting portion is provided between the first connecting portion and the second connecting portion. In addition, the first connecting portion and the second connecting portion are arranged adjacent to the first edge and the second edge respectively. Any row of the first interdigitated portions between the first connecting portion and the second connecting portion is a plurality of interrupted segments, and any row of second interdigitated portions between the first connecting portion and the second connecting portion is a plurality of interrupted segments.

In the foregoing technical solutions, as shown in FIG. 2 and FIG. 6, the back contact solar cell is a half-cut solar cell, the first connecting portion is adjacent to the first edge 1, and the second connecting portion is adjacent to the second edge 2.

In the foregoing technical solutions, as shown in FIG. 1, the back contact solar cell is a full-cut solar cell. In one of the sections, the first connecting portion is adjacent to the first edge 1, and the second connecting portion is adjacent to the second edge 2. In the other section, the second connecting portion is adjacent to the first edge 1, and the first connecting portion is adjacent to the second edge 2. Alternatively, in the two sections, a boundary of the first doped layer 3 is adjacent to the first edge 1, and a boundary of the second doped layer 4 is adjacent to the second edge 2. Alternatively, in the two sections, a boundary of the first doped layer 3 is adjacent to the second edge 2, and a boundary of the second doped layer 4 is adjacent to the first edge 1.

Specifically, the first connecting portion and the second connecting portion both extend along a direction parallel to the first edge 1, and the first interdigitated portions and the second interdigitated portions all extend along a direction perpendicular to the first edge 1. The first edge 1 may be only adjacent to a boundary of the first connecting portion, or the first edge 1 may be only adjacent to a boundary of the second connecting portion, or one portion of the first edge 1 is adjacent to a boundary of the first connecting portion, and an other portion of the first edge 1 is adjacent to a boundary of the second connecting portion. Similarly, the second edge 2 may be only adjacent to a boundary of the first connecting portion, or the second edge 2 may be only adjacent to a boundary of the second connecting portion, or one portion of the second edge 2 is adjacent to a boundary of the first connecting portion, and an other portion of the first edge 1 is adjacent to a boundary of the second connecting portion. In addition, a first isolation region 6 is arranged between the first connecting portion and the first edge 1 or second edge 2 adjacent to the first connecting portion. A second isolation region 9 is arranged between the second connecting portion and the first edge 1 or second edge 2 adjacent to the second connecting portion.

By using the foregoing technical solutions, the first isolation region 6 or the second isolation region 9 extends along a direction parallel to the first edge 1 and the second edge 2, which is conducive to formation of the first isolation region 6 and the second isolation region 9.

It should be noted that in the foregoing embodiments, a first isolation region is arranged between the first connecting portion and the edge and/or between the first interdigitated portions and the edge. A second isolation region is arranged between the second connecting portion and the edge and/or between the second interdigitated portions and the edge.

Since the third edge 5 may be perpendicular to the first edge 1 and the second edge 2, the third edge 5 may be made adjacent to a boundary of the first interdigitated portions, and the first edge 1 may be made adjacent to a boundary of the first connecting portion. By using the technical solution, an isolation region near the third edge 5 is the same as an isolation region near the first edge 1. When being processed, the isolation region near the first edge 1 and the isolation region near the third edge 5 can be consecutively processed, thereby facilitating processing and manufacturing, and improving processing efficiency of the back contact solar cell. Alternatively, the third edge 5 is adjacent to a boundary of the second interdigitated portions, and the second edge 2 is adjacent to a boundary of the second connecting portion. By using the technical solution, an isolation region near the third edge 5 is the same as an isolation region near the second edge 2. When being processed, the isolation region near the third edge 5 and the isolation region near the second edge 2 can be consecutively processed, thereby facilitating processing and manufacturing, and improving processing efficiency of the back contact solar cell.

As shown in FIG. 2, one end of the third edge 5 is connected to an end of the first edge 1 by a first chamfer 7. An other end of the third edge 5 is connected to an end of the second edge 2 by a second chamfer 10. Such an arrangement can reduce cracks at corners of the silicon wafer can be reduced, to prevent the corners of the silicon wafer from being cracked under the action of external stress.

Further, as shown in FIG. 2, a boundary of the first doped layer 3 is adjacent to the first chamfer 7, and a boundary of the second doped layer 4 is adjacent to the second chamfer 10. Because stress at a position of a chamfer of the solar cell is large, which is more prone to hidden cracking, if a doped layer is too close to the chamfer (the first chamfer 7 and the second chamfer 10), hidden cracking of the solar cell is transferred to the doped layer, resulting in a defect of the doped layer. Therefore, an isolation region needs to be arranged between the chamfer and the doped layer. For the first doped layer 3, laser modification needs to be performed first, and then wet etching needs to be performed, so that the boundary of the first doped layer 3 adjacent to the first chamfer 7 is a stepped edge **3*a*. While ensuring a larger width of the first isolation region 6 between the first doped layer 3 and the first chamfer 7, the stepped edge 3*a* can disperse stress, to prevent stress from concentrating at the boundary of the first doped layer 3 adjacent to the first chamfer 7, thereby reducing hidden cracking. In addition, the width of the second isolation region 9 between the second doped layer 4 and the second chamfer 10 is smaller than the width of the first isolation region 6. The second isolation region 9 needs to formed only by wet etching. The boundary of the second doped layer 4 adjacent to the second chamfer 10 is an arc-shaped edge 4*b*, to ensure maximum current collection, and make it easier to print a grid line on the second doped layer 4**.

A third isolation region 8 is arranged between the first doped layer 3 and the second doped layer 4, to avoid leakage of the back contact solar cell. In addition, reliability performance of the solar cell in a later product can be improved. A width of the third isolation region 8 may range from 60 μm to 200 μm. For example, the width of the third isolation region 8 is 60 μm, 80 μm, 100 μm, 120 μm, 140 μm, 160 μm, 180 μm, or 200 μm.

Figure 3:
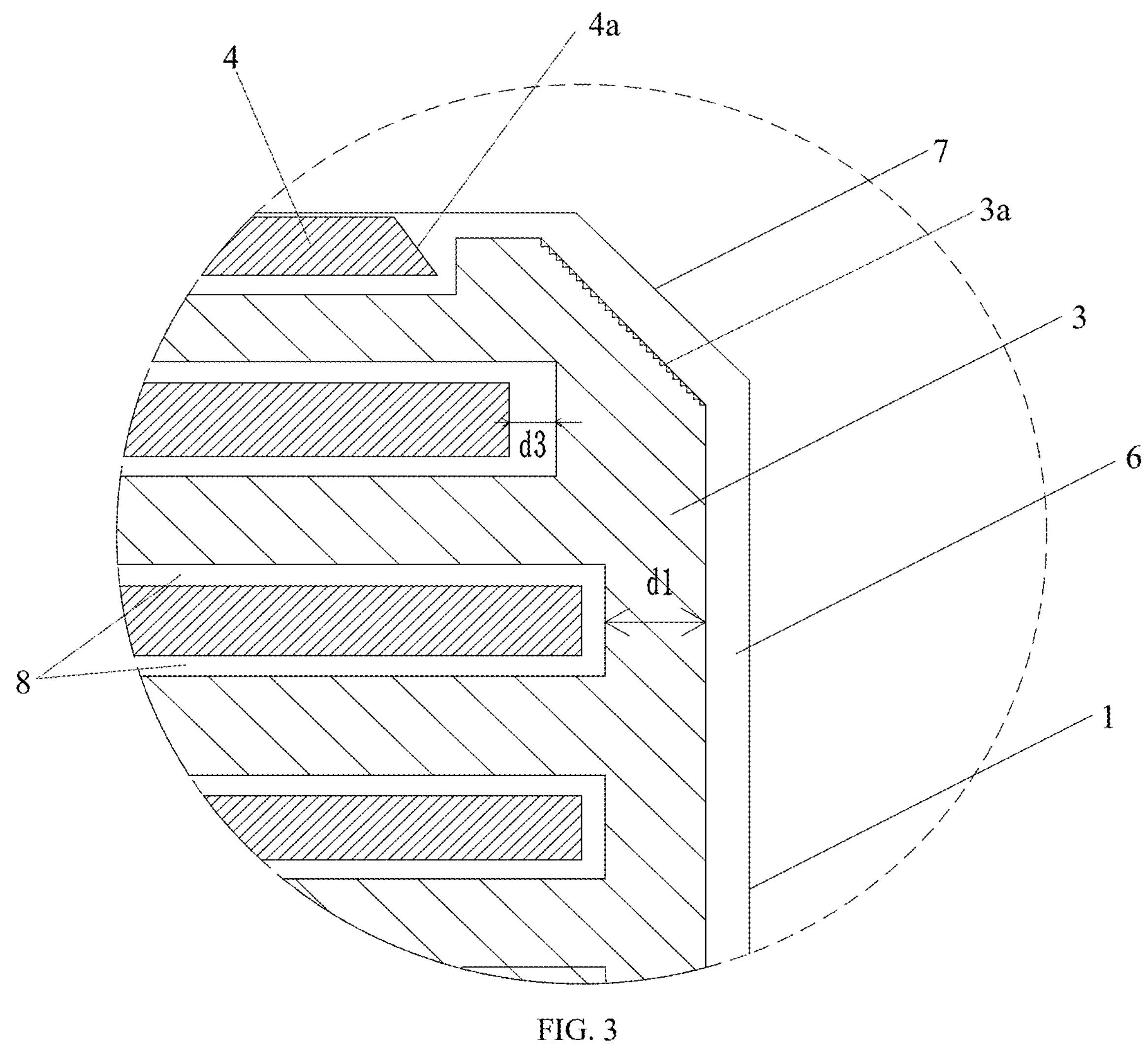
FIG. 3 is a partial enlarged view of a region A in FIG. 2.

As shown in FIG. 3, because stress at a position of a chamfer of the solar cell is larger, which is more prone to hidden cracking, if the second interdigitated portions are too close to the first chamfer 7, hidden cracking of the solar cell is transferred to the second interdigitated portions, resulting in a defect of the second interdigitated portions. Therefore, a spacing distance d3 between a tip of the second interdigitated portion close to the first chamfer 7 and the first connecting portion along an extending direction of the third edge is greater than a spacing distance between a tip of the remaining second interdigitated portions and the first connecting portion along the extending direction of the third edge 5. That is, the spacing distance between the tip of the second interdigitated portion close to the first chamfer 7 and the first connecting portion along the extending direction of the third edge 5 is larger, so that the distance from the tip of the second interdigitated portions to the first chamfer 7 is larger, which reduces defects, such as hidden cracking, of the second interdigitated portions. There may be one or more second interdigitated portions close to the first chamfer 7.

As shown in FIG. 4, in consideration of that stress at a position of a chamfer of the solar cell is larger, which is more prone to hidden cracking, if the first interdigitated portions are too close to the second chamfer 10, hidden cracking of the solar cell is transferred to the first interdigitated portions, resulting in a defect of the first interdigitated portions. Therefore, a spacing distance d4 between a tip of the first interdigitated portion close to the second chamfer 10 and the second connecting portion along an extending direction of the third edge is greater than a spacing distance between a tip of the remaining first interdigitated portions and the second connecting portion along the extending direction of the third edge. That is, the spacing distance between the tip of the first interdigitated portion close to the second chamfer 10 and the second connecting portion along the extending direction of the third edge 5 is larger, so that the distance from the tip of the first interdigitated portions to the second chamfer 10 is larger, which reduces defects, such as hidden cracking, of the first interdigitated portions. There may be one or more first interdigitated portions close to the second chamfer 10.

In addition, an edge of a tip of an interdigitated portion (the first interdigitated portion and the second interdigitated portion), opposite in polarity to a connecting portion (the first connecting portion and the second connecting portion) adjacent to the first edge 1 and adjacent to the third edge 5, close to the first chamfer 7 is a beveled edge 4*a*. The beveled edge 4*a* gradually inclines toward a direction closer to the first chamfer 7 in a direction away from the third edge 5.

As shown in FIG. 2 and FIG. 3, when the boundary of the first doped layer 3 is adjacent to the first chamfer 7, the second interdigitated portions are adjacent to the third edge 5. An edge of a tip of the second interdigitated portion close to the first connecting portion is a beveled edge 4*a*. The beveled edge 4*a* gradually inclines toward a direction closer to the first chamfer 7 in a direction away from the third edge 5. The second interdigitated portion close to the first connecting portion is a second interdigitated portion close to the first connecting portion adjacent to the first edge or the second edge. Through such an arrangement, a pointed position of the beveled edge 4*a* being away from the third edge 5 can prevent stress from concentrating at the pointed position of the beveled edge 4*a* and causing hidden cracking while making an area of the first doped layer 3 near the first chamfer 7 larger, which can disperse stress in a region of the first doped layer 3 close to the first chamfer 7, thereby preventing stress concentration in the region of the first doped layer 3 close to the first chamfer 7, and reducing hidden cracking.

Alternatively, when the boundary of the second doped layer 4 is adjacent to the second chamfer 10, the first interdigitated portions are adjacent to the third edge 5. An edge of a tip of the first interdigitated portion close to the second connecting portion is a beveled edge 4*a*. The beveled edge 4*a* gradually inclines toward a direction closer to the second chamfer 10 in a direction away from the third edge 5. The first interdigitated portion close to the second connecting portion is a first interdigitated portion close to the second connecting portion adjacent to the first edge or the second edge. Through such an arrangement, a pointed position of the beveled edge 4*a* being away from the third edge 5 can prevent stress from concentrating at the pointed position of the beveled edge 4*a* and causing hidden cracking while making an area of the second doped layer 4 near the second chamfer 10 larger, which can disperse stress in a region of the second doped layer 4 close to the second chamfer 10, thereby preventing stress concentration in the region of the second doped layer 4 close to the second chamfer 10, and reducing hidden cracking.

In another embodiment, as shown in FIG. 3 and FIG. 4, a width d1 of a portion of the first connecting portion adjacent to the first edge 1 is smaller than a width d2 of a portion of the second connecting portion adjacent to the second edge 2. That is, the width of the portion of the first connecting portion adjacent to the first edge 1 is d1, and the width of the portion of the second connecting portion adjacent to the second edge 2 is d2, d1<d2. Specifically, in a region close to the first edge 1 and the second edge 2, the width d1 of the first connecting portion is smaller than the width d2 of the second connecting portion.

Further, 600 μm≤d1≤800 μm. For example, the width d1 of the portion of the first connecting portion adjacent to the first edge 1 may be 600 μm, 620 μm, 650 μm, 680 μm, 700 μm, 720 μm, 750 μm, 780 μm, or 800 μm. In addition, 800 μm≤d2≤1100 μm. For example, the width d2 of the portion of the second connecting portion adjacent to the second edge 2 may be 800 μm, 850 μm, 900 μm, 950 μm, 1000 μm, 1050 μm, or 1100 μm.

In another embodiment, the edge includes a first edge 1, a second edge 2 arranged opposite to the first edge 1, and a third edge 5 located between the first edge 1 and the second edge 2. The third edge 5 may be perpendicular to the first edge 1 and the second edge 2. The first doped layer 3 includes a plurality of first strip-shaped portions extending along the extending direction the third edge 5, and the second doped layer 4 includes a plurality of second strip-shaped portions extending along the extending direction the third edge 5. The plurality of first strip-shaped portions and the plurality of second strip-shaped portions are sequentially and alternately spaced apart along an extending direction of the first edge or the second edge. Heads of two ends of the first strip-shaped portions and the second strip-shaped portions are respectively adjacent to the first edge and the second edge. In this embodiment, a first isolation region 6 is arranged between the first strip-shaped portions and the edge, and a second isolation region 9 is arranged between the second strip-shaped portions and the edge. In this embodiment, a boundary of the second strip-shaped portions is adjacent to the third edge. The second doped layer 4 being close to the third edge 5 can ensure better passivation of the edge of the solar cell. However, if the first doped layer 3 opposite to the substrate 12 is close to the third edge 5, the first doped layer 3 at a position of the third edge 5 has higher recombination efficiency and a shorter minority carrier life time, which is not conducive to improving the photoelectric conversion efficiency. It should be noted that in this embodiment, the back contact solar cell may be a full-cut solar cell or a half-cut solar cell.

In the foregoing embodiment, because stress at a position of a chamfer of the solar cell is larger, which is more prone to hidden cracking, if the strip-shaped portions (the first strip-shaped portions and the second strip-shaped portions) are too close to the first chamfer 7, hidden cracking of the solar cell is transferred to the strip-shaped portions, resulting in a defect of the strip-shaped portions. Therefore, a spacing distance between a tip of the first strip-shaped portion close to the first chamfer 7 and the first edge 1 along the extending direction of the third edge 5 is greater than a spacing distance between a tip of the remaining first strip-shaped portions and the first edge 1 along the extending direction of the third edge 5. A spacing distance between a tip of the second strip-shaped portion close to the first chamfer 7 and the first edge 1 along an extending direction of the third edge 5 is greater than a spacing distance between a tip of the remaining second strip-shaped portions and the first edge 1 along the extending direction of the third edge 5. That is, a spacing distance between a tip of a strip-shaped portion close to the first chamfer 7 and the first edge 1 along the extending direction of the third edge 5 is larger, so that the tip of the strip-shaped portion is more distant from the first chamfer 7, which reduces defects, such as hidden cracking, of the strip-shaped portion. There may be one or more first strip-shaped portions and one or more second strip-shaped portions close to the first chamfer 7.

In the foregoing embodiment, because stress at a position of a chamfer of the solar cell is larger, which is more prone to hidden cracking, if the strip-shaped portions (the first strip-shaped portions and the second strip-shaped portions) are too close to the second chamfer 10, hidden cracking of the solar cell is transferred to the strip-shaped portions, resulting in a defect of the strip-shaped portions. Therefore, a spacing distance between a tip of the first strip-shaped portion close to the second chamfer 10 and the second edge 2 along the extending direction of the third edge 5 is greater than a spacing distance between a tip of the remaining first strip-shaped portions and the second edge 2 along the extending direction of the third edge 5. A spacing distance between a tip of the second strip-shaped portion close to the second chamfer 10 and the second edge 2 along an extending direction of the third edge 5 is greater than a spacing distance between a tip of the remaining second strip-shaped portions and the second edge 2 along the extending direction of the third edge 5. That is, a spacing distance between a tip of a strip-shaped portion close to the second chamfer 10 and the second edge 2 along the extending direction of the third edge 5 is larger, so that the tip of the strip-shaped portion is more distant from the second chamfer 10, which reduces defects, such as hidden cracking, of the strip-shaped portion. There may be one or more first strip-shaped portions and one or more second strip-shaped portions close to the second chamfer 10.

In the foregoing embodiments, a width of the first isolation region 6 ranges from 80 μm to 200 μm. In this embodiment, the width of the first isolation region 6 is set within a proper range, to prevent an excessively small distance between the first doped layer 3 and the edge from leading to a high leakage risk while preventing an excessively large distance between the first doped layer 3 and the edge from reducing an effective power generation area and affecting power generation efficiency. For example, the width of the first isolation region 6 is 80 μm, 90 μm, 100 μm, 110 μm, 120 μm, 130 μm, 140 μm, 150 μm, 160 μm, 170 μm, 180 μm, 190 μm, or 200 μm.

A width of the second isolation region 9 ranges from 10 μm to 50 μm. The width of the second isolation region 9 is set within a proper range, to prevent an excessively small distance between the second doped layer 4 and the edge from leading to high carrier recombination efficiency while preventing an excessively large distance between the second doped layer 4 and the edge from reducing an effective power generation area and affecting power generation efficiency. For example, the width of the second isolation region 9 is 10 μm, 20 μm, 30 μm, 40 μm, or 50 μm.

In some embodiments, a width of the second isolation region 9 may be close to 0, and the second doped layer 4 reaches the second edge 2, and may extend to a side surface of the semiconductor substrate. In addition, it is possibly because during patterning of the second doped layer 4, the second doped layer 4 at the edge of the substrate is naturally side-etched by the etching solution to form the second isolation region 9 whose width is slightly greater than 0. In this embodiment, the width of the second isolation region 9 may range from 0 to 50 μm.

In an embodiment, a difference between the width of the first isolation region 6 and the width of the second isolation region 9 is greater than or equal to 30 μm and less than or equal to 190 μm, that is, the width of the first isolation region 6 is greater than the width of the second isolation region 9 by 30 μm to 190 μm. In this way, an excessively large difference between the width of the first isolation region 6 and the width of the second isolation region 9 can be prevented from causing a large difference between a total area of the first doped layer 3 and a total area of the second doped layer 4, and affecting the power generation efficiency. For example, the difference between the width of the first isolation region 6 and the width of the second isolation region 9 may be 30 μm, 40 μm, 50 μm, 60 μm, 70 μm, 80 μm, 90 μm, 100 μm, 110 μm, 120 μm, 130 μm, 140 μm, 150 μm, 160 μm, 170 μm, 180 μm, or 190 μm.

As shown in FIG. 5, the first isolation region 6 and/or the second isolation region 9 has a portion recessed into the substrate 12. A side of the recessed portion facing away from a side wall of the substrate 12 forms an inclined portion that inclines relative to the first surface. An angle between the inclined portion and the first surface is greater than or equal to 53° and less than or equal to 57°. In a process of forming the first isolation region 6 and the second isolation region 9 by etching, an alkaline solution corrodes from a surface inward. A corrosion principle is anisotropic corrosion of silicon under the alkaline solution (which is the same as that of a conventional alkaline texturing process). A formed side wall is actually a side wall of a pyramid of a textured surface, so that an inclined portion is formed. That is, along a direction from bottom to top of the substrate 12, inclined portions all gradually incline to a direction away from the side wall of the substrate 12. An angle between the inclined portion of the first isolation region 6 and the first surface is a, and an angle between the inclined portion of the second isolation region 9 and the first surface is β. The angle a and the angle β can ensure that subsequently, a passivation layer can transition continuously and smoothly, that is, transition from the doped layer to the substrate of the isolation region, thereby ensuring electrical isolation and a water vapor barrier effect of the isolation region.

For example, the angle a between the first inclined portion and the first surface may be 53°, 53.5°, 54°, 54.5°, 55°, 55.5°, 56°, 56.5°, or 57°. For example, the angle β between the second inclined portion and the first surface may be 53°, 53.5°, 54°, 54.5°, 55°, 55.5°, 56°, 56.5°, or 57°.

The first isolation region 6 and/or the second isolation region 9 has a portion recessed into the substrate. A bottom surface of the recessed portion forms a textured structure. The textured structure may be a ridged structure, or may be a pyramidal textured structure. In view of the above, in a process of forming the first isolation region 6 and the second isolation region 9 by etching, an alkaline solution corrodes from a surface inward. A corrosion principle is anisotropic corrosion of silicon under the etching solution (which is the same as that of a conventional alkaline texturing process). Formed bottom walls of the first isolation region 6 and the second isolation region 9 are pyramidal textured structures, so that the first isolation region 6 and the second isolation region 9 can better isolate the doped layer from the edge of the first surface. In addition, the bottom walls of the first isolation region 6 and the second isolation region 9 being textured structures can increase a path length for water vapor to enter the solar cell and reduce entry of water vapor, thereby preventing water vapor from affecting performance of the doped layer.

In another specific embodiment, a length and/or a width of the substrate 12 ranges from 166 μm to 210 μm. For example, the length of the substrate 12 may be 166 μm, 170 μm, 180 μm, 190 μm, 200 μm, or 210 μm. The width of the substrate 12 may be 166 μm, 170 μm, 180 μm, 190 μm, 200 μm, or 210 μm.

A thickness of the substrate 12 ranges from 100 μm to 170 μm. For example, the thickness of the substrate 12 may be 100 μm, 110 μm, 120 μm, 130 μm, 140 μm, 150 μm, 160 μm, or 170 μm.

A thickness of the first doped layer 3 and/or a thickness the second doped layer 4 ranges 150 nm to 400 nm. Specifically, the thickness of the first doped layer 3 may be 150 nm, 180 nm, 200 nm, 220 nm, 250 nm, 280 nm, 300 nm, 320 nm, 350 nm, 380 nm, or 400 nm. The thickness of the second doped layer 4 may be 150 nm, 180 nm, 200 nm, 220 nm, 250 nm, 280 nm, 300 nm, 320 nm, 350 nm, 380 nm, or 400 nm. Therefore, while ensuring a good field passivation effect, a poly thickness is reduced as much as possible, to reduce the parasite absorption.

In a possible implementation, the back contact solar cell further includes a passivation layer 11 covering the first doped layer 3, the second doped layer 4, the first isolation region 6, and the second isolation region 9. The passivation layer 11 can improve stability and reliability of the substrate 12, protect a surface of the substrate 12, and prevent the surface of the substrate 12 from being oxidized, corroded, contaminated, and so on. In addition, the passivation layer 11 covers an inner wall of the first isolation region 6 and an inner wall of the second isolation region 9, to further prevent water vapor from entering the solar cell from the isolation region, and prevent water vapor from affecting the performance of the doped layer.

In addition, an embodiment of the present disclosure further provides a photovoltaic module, including at least two back contact solar cells and a plurality of electrical connectors. The back contact solar cell is the back contact solar cell according to any one of the foregoing embodiments. The plurality of electrical connectors connect the at least two back contact solar cells. Compared with the related art, beneficial effects of the photovoltaic module provided in this embodiment of the present disclosure are the same as the beneficial effects of the foregoing back contact solar cell, and details are not described herein again.

The plurality of back contact solar cells may be connected in series and/or parallel by the electrical connectors. The electrical connector may be a soldering strip, and specifically, may be a tin-plated copper strip or a tin-coated copper strip.

In the foregoing photovoltaic module, the edge includes a first edge 1, a second edge 2 arranged opposite to the first edge 1, and a third edge 5 located between the first edge and the second edge. The first edge 1 and the second edge 2 are parallel to each other and are respectively located on two opposite sides of the first surface. The third edge 5 may be perpendicular to the first edge 1 and the second edge 2.

In a specific embodiment, the first doped layer 3 and the second doped layer 4 are arranged in an interdigitated manner. The first doped layer 3 includes a first connecting portion and a plurality of first interdigitated portions. At least one of the first interdigitated portions is electrically connected to the first connecting portion. The second doped layer 4 includes a second connecting portion and a plurality of second interdigitated portions. At least one of the second interdigitated portions is electrically connected to the second connecting portion. The first connecting portion and the second connecting portion extend along the first edge and the second edge. A plurality of ones of the first interdigitated portions and a plurality of ones of the second interdigitated portions between the first connecting portion and the second connecting portion are respectively distributed in a plurality of rows. The first interdigitated portions in a plurality of rows and the second interdigitated portions in a plurality of rows are distributed in a staggered manner and at intervals.

In the foregoing solution, the first connecting portion and the second connecting portion may be arranged adjacent to the first edge 1 and the second edge 2 respectively. A plurality of rows of the first interdigitated portions and a plurality of rows of the second interdigitated portions are provided between the first connecting portion and the second connecting portion. The first interdigitated portions in a plurality of rows and the second interdigitated portions in a plurality of rows between the first connecting portion and the second connecting portion are distributed in a staggered manner and at intervals.

In the foregoing technical solution, orthographic projections of the plurality of electrical connectors and the first connecting portion of the first doped layer 3 adjacent to the first edge 1 and/or the second edge 2 do not overlap on the back contact solar cell. Orthographic projections of the plurality of electrical connectors and the second connecting portion of the second doped layer 4 adjacent to the first edge 1 and/or the second edge 2 do not overlap on the back contact solar cell. That is, the first connecting portion adjacent to the first edge and/or the second edge 2 and the electrical connectors are arranged in a staggered manner, and the second connecting portion adjacent to the first edge and/or the second edge 2 and the electrical connectors are arranged in a staggered manner. In this way, arranging the electrical connectors to deviate from the first connecting portion and the second connecting portion adjacent to the first edge 1 and/or the second edge 2 can prevent the electrical connectors from damaging the first connecting portion and the second connecting portion adjacent to the first edge 1 and/or the second edge 2, thereby ensuring collection efficiency of the first connecting portion and the second connecting portion adjacent to the first edge 1 and/or the second edge 2 while further improving electrical isolation.

For a back contact solar cell with a busbar, connecting portions (the first connecting portion of the first doped layer 3 and/or the second connecting portion of the second doped layer 4) are provided near the first edge 1 and the second edge 2 and in the middle. In this case, orthographic projections of two electrical connectors adjacent to the first edge 1 and the second edge 2 and the connecting portions adjacent to the first edge 1 and the second edge 2 on the back contact solar cell do not overlap, and orthographic projections of an electrical connector located in the middle and the connecting portion located in the middle on the back contact solar cell overlap.

In the foregoing embodiments, for a back contact solar cell without a busbar, connecting portions (the first connecting portion of the first doped layer 3 and/or the second connecting portion of the second doped layer 4) are provided only near the first edge 1 and the second edge 2. In this case, orthographic projections of two electrical connectors adjacent to the first edge 1 and the second edge 2 and the connecting portions adjacent to the first edge 1 and the second edge 2 on the back contact solar cell do not overlap.

For another back contact solar cell without a busbar, the first doped layer 3 includes a plurality of first strip-shaped portions extending along the extending direction the third edge 5, and the second doped layer 4 includes a plurality of second strip-shaped portions extending along the extending direction the third edge 5. The plurality of first strip-shaped portions and the plurality of second strip-shaped portions are sequentially and alternately spaced apart along an extending direction of the first edge 1 or the second edge 2. Heads of two ends of the first strip-shaped portions and the second strip-shaped portions are respectively adjacent to the first edge 1 and the second edge 2. The implementation is that a doped layer of a back contact solar cell without a busbar does not have an interdigitated structure, and includes only a strip-shaped portion. A first isolation region 6 or a second isolation region 9 is formed between a head of an end of the strip-shaped portion and an edge corresponding to the head, to ensure an isolation effect at the first edge 1 and the second edge 2. In addition, the electrical connector is arranged to intersect the strip-shaped portion vertically, and the electrical connector is electrically connected to the strip-shaped portion at an intersection position through an electrode pattern.

An embodiment of the present disclosure further provides a preparation method for a back contact solar cell, including the following steps:

- providing a substrate 12, the substrate 12 having a first surface and a second surface opposite to the first surface, the first surface having an edge, and the first surface having a first doped layer 3, a second doped layer 4, and a third region between the first doped layer 3 and the second doped layer 4;
- forming the first doped layer 3 on the first surface of the substrate 12 and patterning the first doped layer 3, a doping type of the first doped layer 3 being opposite to a doping type of the substrate 12;
- forming the second doped layer 4 on the first surface of the substrate 12 and patterning the second doped layer 12, a doping type of the second doped layer 4 being opposite to the doping type of the first doped layer 3; and
- forming a first isolation region 6 running through the first doped layer 3 along a thickness direction of the substrate 12 when patterning the first doped layer 3 or the second doped layer 4, the first isolation region 6 spacing the first doped layer 3 from the edge; and forming a second isolation region 9 running through the second doped layer 4 along the thickness direction of the substrate 12, the second isolation region 9 spacing the second doped layer 4 from the edge, and a width of the first isolation region 6 being greater than a width of the second isolation region 9.

Compared with the related art, beneficial effects of the preparation method for a back contact solar cell provided in this embodiment of the present disclosure are the same as the beneficial effects of the foregoing back contact solar cell, and details are not described herein again.

The foregoing method for manufacturing a back contact solar cell may further include the following steps:

- forming a passivation layer 11 covering the first doped layer 3, the second doped layer 4, the first isolation region 6, and the second isolation region 9; and
- forming a first electrode connected to the first doped layer 3, and forming a second electrode connected to the second doped layer 4.

In an actual application, damage removal treatment, such as polishing and cleaning, needs to be performed on the substrate 12. A process of forming the first doped layer 3 on the substrate 12 and a process of forming a doped film layer on the first doped layer 3 and the first surface may be a plasma chemical vapor deposition (PECVD) process, a hot wire chemical vapor deposition process, a physical vapor deposition (PVD) process, a low pressure chemical vapor deposition (LPCVD) process, a catalytic chemical vapor deposition process, or the like. A process of removing the first doped layer 3 located on the second doped layer and the third region and removing the doped film layer located on the third region may be a laser etching process, an ion milling etching process, a plasma etching process, a reactive ion etching process, an alkali etching process, an acid etching process, and the like.

In some embodiments, a method for forming the first doped layer 3 and the doped film layer is an in-situ doping method or an ex-situ doping method. That is, the first doped layer 3 and the doped film layer may be directly formed, or an intrinsic semiconductor layer and an intrinsic semiconductor film layer may be first formed, and then the first doped layer 3 and the doped film layer are formed separately through doping.

The step of forming a first isolation region 6 running through the first doped layer 3 along a thickness direction of the substrate 12 includes: first irradiating a portion of the first doped layer 3 at a position corresponding to the first isolation region 6 with a laser, and then forming the first isolation region 6 running through the first doped layer 3 along the thickness direction of the substrate 12 by etching using an etching solution. The step of forming a second isolation region 9 running through the second doped layer 4 along the thickness direction of the substrate 12 includes: forming the second isolation region 9 running through the second doped layer 4 along the thickness direction of the substrate 12 by etching using the etching solution. Since the width of the first isolation region 6 is larger, laser irradiation is first used, and since the width of the second isolation region 9 is smaller, the second isolation region 9 is formed only by etching by using an etching solution, thereby ensuring that the width of the first isolation region 6 is greater than the width of the second isolation region 9.

In addition, the forming a first isolation region 6 running through the first doped layer 3 along a thickness direction of the substrate 12 includes: forming a portion of the first isolation region 6 recessed into the substrate 12, a bottom surface of the recessed portion forming a textured structure. The textured structure includes a pyramidal textured structure.

The forming a second isolation region 9 running through the second doped layer 4 along the thickness direction of the substrate 12 includes: forming a portion of the second isolation region 9 recessed into the substrate 12, a bottom surface of the recessed portion forms a textured structure. The textured structure includes a pyramidal textured structure. The bottom walls of the first isolation region and the second isolation region being textured structures can increase a path length for water vapor to enter the solar cell and reduce entry of water vapor, thereby preventing water vapor from affecting performance of the doped layer.

In an actual application, widths of the first electrode and the second electrode range from 5 μm to 100 μm. A process of forming the first electrode and the second electrode may be an electroplating process, a transfer process (such as a laser transfer process or a thermal transfer process), screen printing, a physical vapor deposition process of a metal or metal oxide electrode, or the like. Apparently, various processes may also be used in combination. For example, electrodes are first printed to form power supply points, and then, power is applied to the power supply points to form a final first electrode and a final second electrode by using an electroplating process. Alternatively, a metal oxide may be vapor deposited. For example, a transparent conductive oxide (TCO) may be used, and then, the first electrode and the second electrode are formed by screen printing or transfer printing.

In an actual application, a process of forming the passivation layer 11 may be a plasma chemical vapor deposition (PECVD) process, a hot wire chemical vapor deposition process, a physical vapor deposition (PVD) process, a low pressure chemical vapor deposition (LPCVD) process, a catalytic chemical vapor deposition process, or the like. When the back contact solar cell has the passivation layer 11, and the first electrode and the second electrode are continuous contact electrodes. The method for forming the first electrode and the second electrode may alternatively be: coating an electrode slurry on the passivation layer 11, and then sintering, to cause the electrode slurry to pass through the passivation layer 11, to respectively form electrical contact with the first doped layer 3 and the second doped layer 4. When the back contact solar cell has the passivation layer 11, and the first electrode and the second electrode are local contact electrodes. The method for forming the first electrode and the second electrode may alternatively be: first opening a first hole and a second hole on the passivation layer 11, and then forming the first electrode and the second electrode in local contact by using a method such as slurry printing, laser transfer, electroplating, chemical plating, photoinduced electroplating, or a physical vapor deposition method such as vacuum evaporation or magnetron sputtering. A hole opening method may include laser film opening, or film opening may be performed by using an etching slurry that can react with the passivation layer 11. The method of making electrical contact through hole opening allows the back contact solar cell to obtain low metal region recombination, thereby ensuring high conversion efficiency of the back contact solar cell. Apparently, the first electrode and the second electrode may also be formed by combining one or more of the foregoing methods, for example, using a physical vapor deposition (PVD) seed layer in combination with an electrode printing method, or screen printing an electrode slurry in combination with an electroplating method, or a combination of a laser transfer method and a screen printing sintering method.

A material of the passivation layer 11 may be one or more of a material of silicon nitride, silicon oxide, silicon oxynitride, aluminum oxide, silicon carbide, and amorphous silicon. For example, a material of the passivation layer 11 may be silicon oxide.

The passivation layer 11 can passivate a surface of the back contact solar cell, and passivate dangling bonds in the first doped layer 3, the second doped layer 4, and the third region, to reduce a carrier recombination speed on the first surface, and improve the photoelectric conversion efficiency. In addition, the passivation layer 11 located on the third region, the first isolation region 6, and the second isolation region 9 also has a function of isolating the first doped layer 3 and the second doped layer 4.

In some possible implementations, after the step of removing the doped film layer located on the third region, the following step is further included: performing texturing on the third region.

In an embodiment, the performing texturing on the third region and the removing the doped film layer located on the third region may be completed in a same procedure. For example, when the doped film layer located on the third region is removed by alkaline etching, a textured structure can be formed on the third region simultaneously.

In some possible implementations, before the forming a passivation layer 11 covering the first doped layer 3, the second doped layer 4, the first isolation region 6, and the second isolation region 9, the following step is further included: performing a heat treatment process, where the heat treatment process is to crystallize at least a portion of the first doped layer 3 and/or the second doped layer 4. Heat treatment is performed on the p-type or n-type semiconductor layer, to further distribute a dopant, or change a structure of the semiconductor layer, which is more conducive to improving performance of the solar cell. For example, when the first doped layer 3 and the second doped layer 4 are amorphous semiconductors or microcrystalline semiconductors, at least a portion of the first doped layer 3 and/or the second doped layer 4 can be crystallized by heating and annealing, thereby improving the electrical connectivity of the first doped layer 3 and the second doped layer 4. In addition, the heating and annealing may further make the tunneling oxide layer more conducive to performing selective transmission of carriers. The heating can also allow doping elements to enter a tunneling oxide layer and the substrate 12, thereby reducing the transmission resistance. In the descriptions of the foregoing implementations, the described specific features, structures, materials, or characteristics may be combined in a proper manner in any one or more of the embodiments or examples.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

The invention claimed is:

1. A back contact solar cell, comprising:

a substrate, having a first surface and a second surface opposite to the first surface, wherein the substrate has an edge; and a first doped layer and a second doped layer, alternately arranged on the first surface, wherein a doping type of the first doped layer is opposite to a doping type of the second doped layer, and wherein the doping type of the second doped layer is the same as a doping type of the substrate, wherein a first isolation region is provided between the edge and a boundary of the first doped layer adjacent to the edge, a second isolation region is provided between the edge and a boundary of the second doped layer adjacent to the edge, wherein a width of at least a portion of the first isolation region is greater than a width of at least a portion of the second isolation region.

2. The back contact solar cell according to claim 1, wherein the edge comprises a first edge and a second edge opposite to the first edge, wherein:

the back contact solar cell is a full-cut solar cell, wherein the first surface is divided into two sections by a line perpendicular to the first edge and the second edge, wherein in one of the two sections, a width of the first isolation region formed between a boundary of the first doped layer and the first edge is greater than a width of the second isolation region formed between a boundary of the second doped layer and the second edge; or the back contact solar cell is a half-cut solar cell, wherein a width of the first isolation region formed between a boundary of the first doped layer and the first edge is greater than a width of the second isolation region formed between a boundary of the second doped layer and the second edge.

3. The back contact solar cell according to claim 1, wherein the edge comprises a first edge, a second edge opposite to the first edge, and a third edge between the first edge and the second edge, wherein the first doped layer and the second doped layer are arranged in an interdigitated manner, wherein the first doped layer comprises a first connecting portion and a plurality of first interdigitated portions, at least one of the first interdigitated portions being electrically connected to the first connecting portion, wherein the second doped layer comprises a second connecting portion and a plurality of second interdigitated portions, at least one of the second interdigitated portions being electrically connected to the second connecting portion, wherein the first connecting portion and the second connecting portion extend along the first edge and the second edge, wherein more than one of the first interdigitated portions between the first connecting portion and the second connecting portion are distributed in a plurality of rows, wherein and more than one of the second interdigitated portions between the first connecting portion and the second connecting portion are distributed in a plurality of rows, wherein the first interdigitated portions in a plurality of rows and the second interdigitated portions in a plurality of rows are distributed in a staggered manner and at intervals; and wherein:

the back contact solar cell is a half-cut solar cell, wherein a width of the first isolation region formed between the first connecting portion and the first edge is greater than a width of the second isolation region formed between the second connecting portion and the second edge; or the back contact solar cell is a full-cut solar cell, wherein a width of the first isolation region formed between the first connecting portion and the first edge is greater than a width of the second isolation region formed between the second connecting portion and the second edge.

4. The back contact solar cell according to claim 3, wherein one or more rows of the first interdigitated portions between the first connecting portion and the second connecting portion are continuous and uninterrupted, and one or more rows of the second interdigitated portions between the first connecting portion and the second connecting portion are continuous and uninterrupted.

5. The back contact solar cell according to claim 3, wherein a row of the first interdigitated portions between the first connecting portion and the second connecting portion is interrupted to form a plurality of segments, and a row of the second interdigitated portions between the first connecting portion and the second connecting portion is interrupted to form a plurality of segments.

6. The back contact solar cell according to claim 3, wherein the third edge is adjacent to a boundary of the first interdigitated portions; or the third edge is adjacent to a boundary of the second interdigitated portions.

7. The back contact solar cell according to claim 3, wherein one end of the third edge is connected to an end of the first edge by a first chamfer, and an other end of the third edge is connected to an end of the second edge by a second chamfer, wherein a boundary of the first doped layer is adjacent to the first chamfer, and a boundary of the second doped layer is adjacent to the second chamfer, and wherein:

the boundary of the first doped layer adjacent to the first chamfer is a stepped edge; and/or the boundary of the second doped layer adjacent to the second chamfer is an arc-shaped edge; and/or a spacing distance between a tip of a second interdigitated portion close to the first chamfer and the first connecting portion is greater than a spacing distance between a tip of remaining second interdigitated portions and the first connecting portion, wherein the spacing distance is measured along an extending direction of the third edge; and/or a spacing distance between a tip of a first interdigitated portion close to the second chamfer and the second connecting portion is greater than a spacing distance between a tip of remaining first interdigitated portions and the second connecting portion, wherein the spacing distance is measured along an extending direction of the third edge.

8. The back contact solar cell according to claim 3, wherein one end of the third edge is connected to an end of the first edge by a first chamfer, and an other end of the third edge is connected to an end of the second edge by a second chamfer, wherein:

the first interdigitated portions are adjacent to the third edge, wherein an edge of a tip of a first interdigitated portion close to the second connecting portion is a beveled edge, the beveled edge being inclining toward a direction closer to the second chamfer in a direction away from the third edge; or the second interdigitated portions are adjacent to the third edge, wherein an edge of a tip of a second interdigitated portion close to the first connecting portion is a beveled edge, the beveled edge inclining toward a direction closer to the first chamfer in a direction away from the third edge.

9. The back contact solar cell according to claim 3, wherein a width of a portion of the first connecting portion adjacent to the first edge is d1, and a width of a portion of the second connecting portion adjacent to the second edge is d2, $d1<d2$.

10. The back contact solar cell according to claim 9, wherein $600\ \mu m \leq d1 \leq 800\ \mu m$, and $800\ \mu m \leq d2 \leq 1100\ \mu m$.

11. The back contact solar cell according to claim 1, wherein the edge comprises a first edge, a second edge arranged opposite to the first edge, and a third edge located between the first edge and the second edge, wherein the first doped layer comprises a plurality of first strip-shaped portions extending along an extending direction the third edge, and the second doped layer comprises a plurality of second strip-shaped portions extending along the extending direction the third edge, wherein the plurality of first strip-shaped portions and the plurality of second strip-shaped portions are sequentially and alternately spaced apart along an extending direction of the first edge or the second edge, and wherein heads of two ends of the first strip-shaped portions and the second strip-shaped portions are respectively adjacent to the first edge and the second edge.

12. The back contact solar cell according to claim 11, wherein a boundary of the second strip-shaped portions is adjacent to the third edge.

13. The back contact solar cell according to claim 1, wherein;

a width of the first isolation region ranges from 80 μm to 200 μm; and/or a width of the second isolation region ranges from 10 μm to 50 μm; and/or a difference between the width of the first isolation region and the width of the second isolation region is greater than or equal to 30 μm and less than or equal to 190 μm.

14. The back contact solar cell according to claim 1, wherein the first isolation region and/or the second isolation region has a portion recessed into the substrate, wherein a side of the recessed portion facing away from a side wall of the substrate comprises an inclined portion that inclines relative to the first surface, wherein an angle between the inclined portion and the first surface is greater than or equal to 53° and less than or equal to 57°.

15. The back contact solar cell according to claim 1, wherein the first isolation region and/or the second isolation region has a portion recessed into the substrate, wherein a bottom surface of the recessed portion comprises a textured structure comprising a pyramidal textured structure.

16. The back contact solar cell according to claim 1, wherein:

a length and/or a width of the substrate ranges from 166 μm to 210 μm; and/or a thickness of the substrate ranges from 100 μm to 170 μm; and/or a thickness of the first doped layer and/or the second doped layer ranges from 150 nm to 400 nm; and/or a third isolation region is arranged between the first doped layer and the second doped layer, a width of the third isolation region ranging from 60 μm to 200 μm.

17. A photovoltaic module, comprising:

at least two back contact solar cells, wherein each back contact solar cell comprises:

a substrate, having a first surface and a second surface opposite to the first surface, wherein the substrate has an edge; and a first doped layer and a second doped layer, alternately arranged on the first surface, wherein a doping type of the first doped layer is opposite to a doping type of the second doped layer, and wherein the doping type of the second doped layer is the same as a doping type of the substrate, wherein a first isolation region is provided between the edge and a boundary of the first doped layer adjacent to the edge, a second isolation region is provided between the edge and a boundary of the second doped layer adjacent to the edge, wherein a width of at least a portion of the first isolation region is greater than a width of at least a portion of the second isolation region; and a plurality of electrical connectors, wherein the plurality of electrical connectors connect the at least two back contact solar cells.

18. The photovoltaic module according to claim 17, wherein the edge comprises a first edge and a second edge arranged opposite to the first edge, wherein the first doped layer and the second doped layer are arranged in an interdigitated manner, wherein the first doped layer comprises a first connecting portion and a plurality of first interdigitated portions, at least one of the first interdigitated portions being electrically connected to the first connecting portion, wherein the second doped layer comprises a second connecting portion and a plurality of second interdigitated portions, at least one of the second interdigitated portions being electrically connected to the second connecting portion, wherein the first connecting portion and the second connecting portion extend along the first edge and the second edge, wherein more than one of the first interdigitated portions between the first connecting portion and the second connecting portion are distributed in a plurality of rows, wherein and more than one of the second interdigitated portions between the first connecting portion and the second connecting portion are distributed in a plurality of rows, wherein the first interdigitated portions in a plurality of rows and the second interdigitated portions in a plurality of rows being distributed in a staggered manner and at intervals, wherein the back contact solar cell is a half-cut solar cell, the first connecting portion being adjacent to the first edge, and the second connecting portion being adjacent to the second edge, and wherein orthographic projections of the plurality of electrical connectors do not overlap with the first connecting portion of the first doped layer and/or the second connecting portion of the second doped layer adjacent to the first edge and/or the second edge.

19. A preparation method for a back contact solar cell, comprising:

providing a substrate, the substrate having a first surface and a second surface opposite to the first surface, the first surface having an edge;

forming a first doped layer on the first surface of the substrate and patterning the first doped layer, a doping type of the first doped layer being opposite to a doping type of the substrate;

forming a second doped layer on the first surface of the substrate and patterning the second doped layer, a doping type of the second doped layer being opposite to the doping type of the first doped layer; and forming a first isolation region through the first doped layer along a thickness direction of the substrate when patterning the first doped layer or the second doped layer, the first isolation region spacing the first doped layer from the edge; and forming a second isolation region through the second doped layer along the thickness direction of the substrate, the second isolation region spacing the second doped layer from the edge, wherein a width of the first isolation region is greater than a width of the second isolation region.

20. The preparation method for a back contact solar cell according to claim 19, wherein forming the first isolation region running through the first doped layer comprises:

irradiating, with a laser, a portion of the first doped layer at a position corresponding to the first isolation region, and forming the first isolation region running through the first doped layer along the thickness direction of the substrate by etching using an etching solution, and wherein forming the second isolation region through the second doped layer comprises:

forming the second isolation region through the second doped layer along the thickness direction of the substrate by etching using the etching solution.

* * * * *